United States Patent
Garcia et al.

(10) Patent No.: US 9,799,421 B2
(45) Date of Patent: Oct. 24, 2017

(54) THICK PRINT COPPER PASTES FOR ALUMINUM NITRIDE SUBSTRATES

(71) Applicant: Heraeus Precious Metals North America Conshohocken, LLC, West Conshohocken, PA (US)

(72) Inventors: Virginia C. Garcia, Carteret, NJ (US); Matthew Sgriccia, Douglassville, PA (US); Mark Challingsworth, Glenside, PA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 176 days.

(21) Appl. No.: 14/288,567

(22) Filed: May 28, 2014

(65) Prior Publication Data
US 2014/0363681 A1   Dec. 11, 2014

Related U.S. Application Data

(60) Provisional application No. 61/832,426, filed on Jun. 7, 2013.

(51) Int. Cl.
*H01B 1/16* (2006.01)
*H05K 1/00* (2006.01)
(Continued)

(52) U.S. Cl.
CPC .............. *H01B 1/16* (2013.01); *H05K 1/092* (2013.01); *H05K 3/1291* (2013.01); *H05K 3/246* (2013.01);
(Continued)

(58) Field of Classification Search
CPC ........ H01B 1/16; H05K 1/092; H05K 3/1291; H05K 3/246; H05K 2201/0338; H05K 2203/1126; H05K 2203/1476
(Continued)

(56) References Cited

U.S. PATENT DOCUMENTS 4,172,919 A * 10/1979 Mitchell .................. H01B 1/16
                                                     106/1.13
4,880,567 A * 11/1989 Prabhu .................... C03C 3/062
                                                     106/1.13
(Continued)

FOREIGN PATENT DOCUMENTS

CN       101309874 A     11/2008
CN       101436441 A     5/2009
(Continued)

*Primary Examiner* — Harold Pyon
*Assistant Examiner* — Danny N Kang
(74) *Attorney, Agent, or Firm* — Blank Rome LLP; Charles R. Wolfe, Jr.

(57) ABSTRACT

The invention provides an electroconductive paste comprising 50-90 wt. % of copper particle, 0.5-10 wt. % of a glass frit, 0.1-5% wt. % of adhesion promoter, which is at least one selected member from the group consisting of cuprous oxide, titanium oxide, zirconium oxide, boron resinate, zirconium resinate, amorphous boron, lithium phosphate, bismuth oxide, aluminum oxide, and zinc oxide, and 5-20 wt. % of an organic vehicle. An article comprising an aluminum nitride substrate and electroconductive paste of the invention is also provided. A method of forming an electroconductive circuit comprising is also provided.

26 Claims, 2 Drawing Sheets

(51) Int. Cl.
  *H05K 1/09* (2006.01)
  *H05K 3/12* (2006.01)
  *H05K 3/24* (2006.01)

(52) U.S. Cl.
  CPC ............... *H05K 2201/0338* (2013.01); *H05K 2203/1126* (2013.01); *H05K 2203/1476* (2013.01)

(58) Field of Classification Search
  USPC .......................................................... 252/500
  See application file for complete search history.

(56) References Cited

U.S. PATENT DOCUMENTS

| | | | |
|---|---|---|---|
| 4,937,016 A | 6/1990 | Suehiro et al. | |
| 5,089,172 A * | 2/1992 | Allison | C03C 3/066 252/512 |
| 5,418,193 A | 5/1995 | Tani et al. | |
| 7,176,152 B2 * | 2/2007 | Brown | C03C 3/064 252/512 |
| 7,625,420 B1 * | 12/2009 | Kodas | B01J 2/003 106/287.18 |
| 2002/0005507 A1 | 1/2002 | Matsumoto | |
| 2005/0277550 A1 | 12/2005 | Brown et al. | |
| 2009/0288709 A1 | 11/2009 | Iida et al. | |
| 2011/0031448 A1 | 2/2011 | Ota et al. | |
| 2011/0083874 A1 | 4/2011 | Kuroki | |
| 2013/0049148 A1 | 2/2013 | Hang et al. | |

FOREIGN PATENT DOCUMENTS

| | | |
|---|---|---|
| EP | 1 747 830 | 1/2007 |
| EP | 1 847 575 | 10/2007 |
| EP | 1 835 512 | 5/2010 |
| JP | H0246603 | 2/1990 |
| JP | 10283840 A * | 10/1998 |
| JP | H-10-283840 A | 10/1998 |
| TW | 200903519 A | 1/2009 |
| TW | 201231613 A | 8/2012 |
| TW | 201232564 A | 8/2012 |
| WO | WO 2012/129554 | 9/2012 |

* cited by examiner

THICK PRINT COPPER PASTES FOR ALUMINUM NITRIDE SUBSTRATES

TECHNICAL FIELD

The present application relates to thick print copper electroconductive paste compositions suitable for use with an aluminum nitride substrate. The copper electroconductive paste compositions described herein are plateable and suitable for wirebonding. They have excellent adhesion to the underlying aluminum nitride substrate. While not limited to such applications, the copper electroconductive paste compositions described herein may be used in high temperature, high voltage and/or high amperage electronics applications (e.g., in electric vehicles).

BACKGROUND

In recent years, it has been desirable to employ aluminum nitride (AlN) substrates for circuit boards used under high-temperature environments, particularly for high power applications. AlN substrates have been promising candidates due to their excellent properties, including high thermal conductivity (130-200 $Wm^{-1}K^{-1}$) and low coefficient of thermal expansion (CTE) (4-4.5 $ppmK^{-1}$). The combination of high thermal conductivity and low CTE gives aluminum nitride good thermal shock resistance. Furthermore, aluminum nitride has a flexural strength exceeding that of alumina and beryllia, exhibits a low hardness which enables it to be machined easily, and is stable at temperatures in excess of 900° C. in an oxidizing environment and up to 1600° C. in a reducing environment.

Despite the promise of aluminum nitride, application of thick-films on aluminum nitride or aluminum nitride-containing substrates is severely limited by the lack of compatible thick-film paste compositions which adhere sufficiently to such materials. In order to adhere metal conductors to aluminum nitride substrates, the use of thick film technology is typically used, which adheres the conductor via a thin reactive layer (oxide film) formed between the metal and substrate by introducing the metal in atomic form to the surface of the ceramic substrate so that the metal, which is extremely active chemically, bonds with the excess oxygen that exists in the surface of the substrate.

There is, therefore, a need for new metal electroconductive paste compositions that exhibit high stability and excellent adhesion properties to an underlying aluminum nitride substrate.

SUMMARY

The invention provides an electroconductive paste composition which exhibits excellent adhesion properties when applied to an aluminum nitride substrate.

The invention provides an electroconductive paste comprising 50-90 wt. % of copper particle, 0.5-10 wt. % of a glass frit, 0.1-5% wt. % of adhesion promoter, which is at least one member selected from the group consisting of cuprous oxide, titanium oxide, zirconium oxide, boron resinate, zirconium resinate, amorphous boron, lithium phosphate, bismuth oxide, aluminum oxide, and zinc oxide, and 5-20 wt. % of an organic vehicle.

According to one aspect of the invention, the copper particles comprise at least one of a first copper particle having a median particle diameter ($d_{50}$) of about 2.0-2.9 µm, a second copper particle having a median particle diameter ($d_{50}$) of about 3.0-3.9 m; or a third copper particle having a median particle diameter ($d_{50}$) of about 4.0-4.9 µm.

According to a preferred embodiment of the invention, the first copper particle has a median particle diameter ($d_{50}$) of about 2.5 µm. According to another preferred embodiment of the invention, the second copper particle has a median particle diameter ($d_{50}$) of about 3.5 µm. According to a further preferred embodiment of the invention, the third copper particle has a median particle diameter ($d_{50}$) of about 4.5 µm.

According to a preferred embodiment of the invention, the first copper particle has a specific surface area of about 0.25-0.50 $m^2/g$. According to another preferred embodiment of the invention, the second copper particle has a specific surface area of about 0.25-0.75 $m^2/g$. According to a further preferred embodiment of the invention, the third copper particle has a specific surface area of about 0.25-0.50 $m^2/g$.

According to a preferred embodiment of the invention, the first copper particle is about 45 to about 65 wt. % of the electroconductive paste. According to another preferred embodiment of the invention, the second copper particle is about 15 to about 30 wt. % of the electroconductive paste. According to a further preferred embodiment of the invention, the third copper particle is about 5 to about 15 wt. % of the electroconductive paste.

According to another aspect of the invention, the glass frit comprises oxides which are substantially lead-free.

According to a preferred embodiment of the invention, the glass frit comprises bismuth, boron and silicon oxides. According to another preferred embodiment of the invention, the glass frit comprises about 45-65% $Bi_2O_3$, 25-45% $SiO_2$, and 1-15% $B_2O_3$, preferably 50-60% $Bi_2O_3$, 30-40% $SiO_2$, and 1-10% $B_2O_3$, most preferably 55-60% $Bi_2O_3$, 35-40% $SiO_2$, and 5-10% $B_2O_3$.

According to a preferred embodiment of the invention, the glass frit is about 0.5 to about 5 wt. % of the electroconductive paste, more preferably about 0.5 to about 1.5 wt. % of the electroconductive paste. According to another preferred embodiment of the invention, the adhesion promoter is bismuth oxide.

According to a preferred embodiment of the invention, the organic vehicle comprises a binder and an organic solvent. According to another preferred embodiment of the invention, the organic vehicle comprises an acrylic binder and texanol. According to a further preferred embodiment of the invention, the organic vehicle is about 5 to about 15 wt. % of the electroconductive paste. According to an additional preferred embodiment of the invention, the organic vehicle is about 5 to about 10 wt. % of the electroconductive paste.

According to a preferred embodiment of the invention, the electroconductive paste further comprises copper oxide. According to another preferred embodiment of the invention, the copper oxide is about 0.5 to about 3 wt. % of the electroconductive paste.

The invention also provides an article comprising (a) an aluminum nitride substrate and (b) an electroconductive electrode comprising an electroconductive paste as previously described. In one embodiment, the electroconductive paste is fired to form the electroconductive electrode.

The invention further provides a method of forming an electroconductive circuit comprising (i) depositing a first layer of base layer electroconductive paste on an aluminum nitride substrate, wherein the base layer electroconductive paste is as previously described, (ii) drying the aluminum nitride substrate with the deposited base layer electroconductive paste at a temperature at about 100° C. to about 125° C. for about 5 to about 10 minutes, (iii) subjecting the deposited base layer electroconductive paste and the aluminum nitride substrate to a temperature of about 900° C. to about 1000° C. in a nitrogen atmosphere comprising from about 1 to about 20 ppm oxygen, (iv) depositing a second layer of a top layer electroconductive paste on the substrate, wherein the top layer electroconductive paste is an electroconductive paste as previously described, (v) drying the aluminum nitride substrate with the deposited top layer electroconductive paste at a temperature at about 100° C. to about 125° C. for about 5 to about 10 minutes, and (vi) subjecting the deposited layers and the aluminum nitride substrate to a temperature of about 900° C. to about 1000° C. in a nitrogen atmosphere comprising from about 1 to about 20 ppm oxygen. According to a preferred embodiment of the invention, steps (iv)-(vi) may be repeated 1-10 times.

According to a preferred embodiment of the invention, the base layer electroconductive paste comprises from about 1 to about 5 wt. % of glass frit. According to another preferred embodiment of the invention, the top layer electroconductive paste comprises from about 0.5 to about 1.5 wt. % of glass frit.

According to a preferred embodiment of the invention, the base layer electroconductive paste comprises from about 1 to about 5 wt. % of adhesion promoter, preferably from about 2 to about 4 wt. %, more preferably about 3 wt. % of adhesion promoter. According to another preferred embodiment of the invention, the top layer electroconductive paste comprises from about 0.25 to about 1.25 wt. % of adhesion promoter, preferably from about 0.75 to about 1.25 wt. %, more preferably about 1 wt. % of adhesion promoter.

According to a preferred embodiment of the invention, the adhesion promoter is bismuth oxide.

According to a preferred embodiment of the invention, the nitrogen atmosphere comprises from about 1 to about 10 ppm oxygen. According to another preferred embodiment of the invention, the nitrogen atmosphere comprises from about 1 to about 3 ppm oxygen.

According to a preferred embodiment of the invention, the step of subjecting the deposited layers and the aluminum nitride substrate to a temperature includes heating from room temperature to about 950° C. for about 5 to about 10 minutes and then cooling to room temperature.

Other objects, advantages and salient features of the invention will become apparent from the following detailed description.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
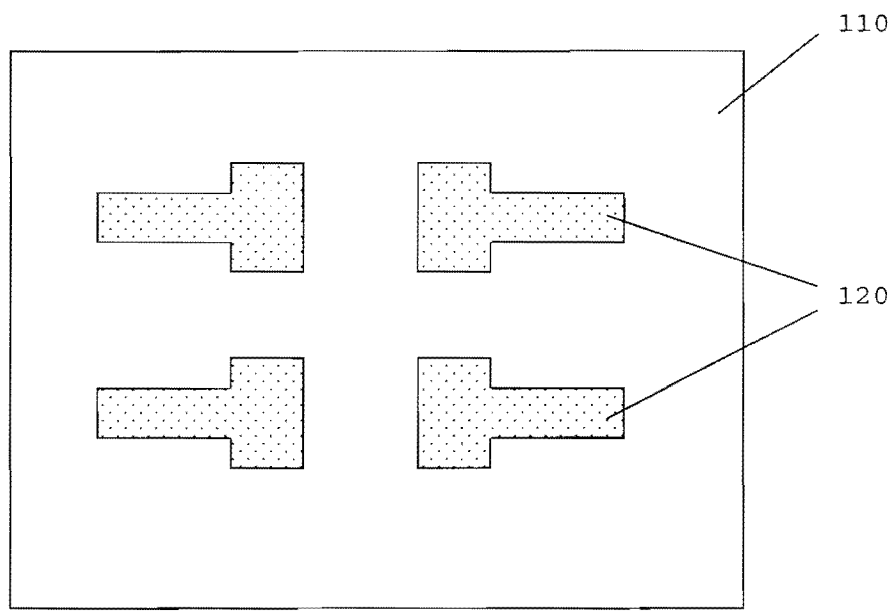
FIG. 1 is a top view of an exemplary copper electroconductive paste printed in a pattern on an aluminum nitride (AlN) substrate.

The invention relates to a copper conductor system developed for forming thick layers of copper suitable for use with an aluminum nitride substrate when fired in a nitrogen atmosphere. In one aspect, the invention relates to a two part copper conductor system with a base layer copper conductor suitable for direct application to an aluminum nitride substrate, and a top layer copper conductor suitable for application atop of the base layer copper conductor or previously applied top layer copper conductor. The inventors have found that the copper electroconductive paste compositions described herein exhibit good plateability, high stability and excellent adhesion properties to the underlying aluminum nitride substrate. Accordingly, while not limited to such applications, the copper electroconductive paste compositions described herein may be used in high temperature, high voltage and high amperage electronics applications (e.g., in electric vehicles).

As used herein, the term "about" or "approximately" means within an acceptable error range for the particular value as determined by one skilled in the art, which will depend in part on how the value is measured or determined, i.e., the limitations of the measurement system. For example, "about" can mean within 1 or more than 1 standard deviations, per the practice in the art. Alternatively, "about" with respect to the formulations can mean plus or minus a range of up to 20%, preferably up to 10%, more preferably up to 5%.

The Copper Particles

The copper particles useful in the paste compositions described herein may be present as elemental copper, one or more copper derivatives, or mixtures thereof. Different copper powders vary based on the production method, purity, particle size, particle shape, apparent density, conductivity, oxygen level, color and flow rate.

The copper particles can exhibit a variety of shapes, surfaces, sizes, surface area to volume ratios, oxygen content and oxide layers. Some examples include, but are not limited to, spherical, angular, elongated (rod or needle like) and flat (sheet like). Copper particles may also be present as a combination of particles of different shapes. Copper particles with a shape, or combination of shapes, which favors advantageous sintering, electrical contact, adhesion and electrical conductivity of the produced electrode are preferred. One way to characterize such shapes without considering surface nature is through the following parameters: length, width, and thickness. In the context of the invention, the length of a particle is given by the length of the longest spatial displacement vector, both endpoints of which are contained within the particle. The width of a particle is given by the length of the longest spatial displacement vector perpendicular to the length vector defined above, both endpoints of which are contained within the particle.

The copper particles are typically irregular, however, the particle size may be approximately represented as the diameter of the "equivalent sphere" which would give the same measurement result. Typically, particles in any given sample of copper particles do not exist in a single size, but are distributed in a range of sizes, i.e., a particle size distribution. One parameter characterizing particle size distribution is $D_{50}$. $D_{50}$ is the median diameter or the medium value of the particle size distribution. It is the value of the particle diameter at 50% in the cumulative distribution. Other parameters of particle size distribution are $D_{10}$, which represents the particle diameter corresponding to 10% cumulative (from 0 to 100%) undersize particle size distribution, and $D_{90}$, which represents the particle diameter corresponding to 90% cumulative (from 0 to 100%) undersize particle size distribution. Particle size distribution may be measured via laser diffraction, dynamic light scattering, imagine, electrophoretic light scattering, or any other methods known to one skilled in the art. In a preferred embodiment, laser diffraction is used.

In one embodiment, the copper particles have substantially uniform shapes (i.e. shapes in which the ratios relating the length, the width and the thickness are close to 1, preferably all ratios lying in a range from about 0.7 to about 1.5, more preferably in a range from about 0.8 to about 1.3 and most preferably in a range from about 0.9 to about 1.2). For example, the copper particles of this embodiment may be spheres, cubes, or a combination thereof, or combinations of one or more thereof with other shapes. In another embodiment, the copper particles have a shape of low uniformity, preferably with at least one of the ratios relating the dimensions of length, width and thickness being above about 1.5, more preferably above about 3 and most preferably above about 5. Shapes according to this embodiment are flake shaped, rod or needle shaped, or a combination of flake shaped, rod or needle shaped with other shapes. In another embodiment, a combination of copper particles with uniform shape and less uniform shape may be used. Specifically, a combination of spherical copper particles and flake-shaped copper particles, having different particle sizes may be used.

In a preferred embodiment, copper particles of different particle sizes may be used. Specifically, the copper particles may comprise at least one of a first copper particle having a median particle diameter ($d_{50}$) of about 2.0-2.9 μm, a second copper particle having a median particle diameter ($d_{50}$) of about 3.0-3.9 μm, or a third copper particle having a median diameter ($d_{50}$) of about 4.0-4.9 μm. In a more preferred embodiment, the copper particles may comprise at least two of a first copper particle having a median particle diameter ($d_{50}$) of about 2.0-2.9 μm, a second copper particle having a median particle diameter ($d_{50}$) of about 3.0-3.9 μm, or a third copper particle having a median diameter ($d_{50}$) of about 4.0-4.9 μm. In a more preferred embodiment, the copper particles comprise a first copper particle having a median particle diameter ($d_{50}$) of about 2.0-2.9 μm, a second copper particle having a median particle diameter ($d_{50}$) of about 3.0-3.9 μm, and a third copper particle having a median diameter ($d_{50}$) of about 4.0-4.9 μm. Without being bound by any particular theory, it is believed that a combination of copper particles having varying median particle diameters improves the adhesive performance of the paste composition.

In the most preferred embodiment, the first copper particle has a median particle diameter ($d_{50}$) of about 2.5 μm, the second copper particle has a median particle diameter ($d_{50}$) of about 3.5 μm, and the third copper particle has a median particle diameter ($d_{50}$) of about 4.5 μm.

A variety of surface types of the copper particles are known in the art. Surface types which favor effective sintering and yield advantageous electrical contact and conductivity of the produced electrodes are favored according to the invention.

Another way to characterize the shape and surface of a copper particle is by its surface area to volume ratio, i.e., specific surface area. The lowest value for the surface area to volume ratio of a particle is embodied by a sphere with a smooth surface. The less uniform and uneven a shape is, the higher its surface area to volume ratio will be. In one embodiment, the copper particles have a high surface area to volume ratio, such as from about $1.0 \times 10^7$ to about $1.0 \times 10^9$ $m^{-1}$, from about $5.0 \times 10^7$ to about $5.0 \times 10^8$ $m^{-1}$ or from about $1.0 \times 10^8$ to about $5.0 \times 10^8$ $m^{-1}$. In another embodiment, the copper particles have a low surface area to volume ratio, such as from about $6 \times 10^5$ to about $8.0 \times 10^6$ $m^{-1}$, from about $1.0 \times 10^6$ to about $6.0 \times 10^6$ $m^{-1}$ or from about $2.0 \times 10^6$ to about $4.0 \times 10^6$ $m^{-1}$. The surface area to volume ratio, or specific surface area, may be measured by BET (Brunauer-Emmett-Teller) method, which is well known in the art.

The copper particles may be present with a surface coating. Any such coating known in the art, and which is considered to be suitable in the context of the present invention, may be employed on the copper particles. In one embodiment, the coating promotes better particle dispersion, which can lead to improved printing and sintering characteristics of the electroconductive paste. In certain embodiments, the coating is present in less than about 10 wt. %, such as less than about 8 wt. %, less than about 5 wt. %, less than about 4 wt. %, less than about 3 wt. %, less than about 2 wt. %, less than about 1 wt. %, or less than about 0.5 wt. %, based on 100% total weight of the copper particles. In one embodiment, the coating is present in an amount of at least about 0.01 wt. %, based upon 100% total weight of the copper particles.

The electroconductive paste composition preferably comprises about 50-90 wt % copper, based upon 100% total weight of the paste composition.

The Glass Frit

In one embodiment, the conductive paste comprises from about 1 to about 10 wt. % (e.g., from about 1 to about 5 wt. %, from about 2 to about 4 wt. %, such as about 3 wt. %) glass frit. In another embodiment, the electroconductive paste comprises from about 1 to about 5 wt. % (e.g., from about 0.5 to about 1.5 wt. %, from about 0.75 to about 1.25 wt. %, such as about 1 wt. %) glass frit.

In one embodiment, one or more glass frit may be used. The glass frit(s) may be substantially lead free (e.g., contains less than about 5 wt. %, such as less than about 4 wt. %, less than about 3 wt. %, less than about 2 wt. %, less than about 1 wt. %, less than about 0.5 wt. %, less than about 0.1 wt. %, or less than about 0.05 wt. % or less than about 0.01 wt. %) of lead. In a preferred embodiment, the glass frit is lead-free, i.e., without any intentionally added lead or lead compound and having no more than trace amounts of lead.

The glass frit may be substantially amorphous, or may incorporate partially crystalline phases or compounds. The glass frit may include a variety of oxides or compounds known to one skilled in the art. For example, silicon, boron, bismuth, zinc, or chromium compounds (e.g., oxides) may be used. Other glass matrix formers or modifiers, such as germanium oxide, phosphorous oxide, vanadium oxide, tungsten oxide, molybdenum oxides, niobium oxide, tin oxide, indium oxide, other alkaline and alkaline earth metal oxides (such as Na, K, Li, Cs, Ca, Sr, Ba, and Mg), intermediates (such as Al, Ti, and Zr), and rare earth oxides (such as $La_2O_3$ and cerium oxides) may also be part of the glass composition.

In a preferred embodiment, the primary components of the glass frit are composed of bismuth, boron and silicon oxides (such as $Bi_2O_3$—$B_2O_3$—$SiO_2$) and optionally some secondary oxides from the alkali and intermediate oxide families previously mentioned. The primary components of the glass frit can also be composed of zinc, boron, and silica (ZnO—$B_2O_3$—$SiO_2$) along with some secondary oxides from the alkali and intermediate oxide families. In one embodiment, a first glass frit comprises bismuth, boron and silicon oxides in the following ratios: about 45-65% $Bi_2O_3$, 25-45% $SiO_2$, and 1-15% $B_2O_3$. Preferably, the first glass frit comprises: 50-60% $Bi_2O_3$, 30-40% $SiO_2$, and 1-10% $B_2O_3$. Most preferably, the first glass frit comprises: 55-60% $Bi_2O_3$, 35-40% $SiO_2$, and 5-10% $B_2O_3$. The glass frit may also comprise 1-10% alkali oxides, preferably, 1-5% of $Na_2O$, $K_2O$, $Li_2O$, or mixtures thereof. The glass frit may also comprise 1-10% intermediate oxides, preferably 3-8% of $Al_2O_3$, $TiO_2$, $ZrO_2$, or mixtures thereof.

Any bismuth, boron and silicon compound (e.g., $Bi_2O_3$, $B_2O_3$, $H_3BO_3$, $SiO_2$), that would produce the referenced oxides at firing temperature may be used.

The glass frits described herein can be made by any process known in the art, including, but not limited to, mixing appropriate amounts of powders of the individual ingredients, heating the powder mixture in air or in an oxygen-containing atmosphere to form a melt, quenching the melt, grinding and ball milling the quenched material and screening the milled material to provide a powder with the desired particle size. For example, glass frit components, in powder form, may be mixed together in a V-comb blender. The mixture is heated to around 800-1300° C. (depending on the materials) for about 30-60 minutes. The glass is then quenched, taking on a sand-like consistency. This coarse glass powder is then milled, such as in a ball mill or jet mill, until a fine powder results. Typically, the glass frit powder is milled to an average particle size of from about 0.01 to about 10 μm, such as from about 0.1 to about 5 μm.

The Adhesion Promoter

Any compound that promotes adhesion of the electroconductive paste to the substrate (e.g., aluminum nitride) may be used. In one embodiment, more than one adhesion promoter may be used. For example, the adhesion promoter(s) may be selected from cuprous oxide, titanium oxide, zirconium oxide, titanium carbide, boron resinate (e.g., boron carboxylate), zirconium resinate (e.g., Zr carboxylate), amorphous boron, lithium phosphate, bismuth oxide, aluminum oxide, zinc oxide and combinations thereof. In a preferred embodiment, the adhesion promoter is a bismuth oxide (e.g., $Bi_2O_3$).

In one embodiment, the adhesion comprises from about 1 to about 5 wt. % (e.g., from about 2 to about 4 wt. %, such as about 3 wt. %) of the electroconductive paste. In another embodiment, the adhesion comprises from about 0.25 to about 1.25 wt. % (e.g., from about 0.75 to about 1.25 wt. %, such as about 1 wt. %) of the electroconductive paste.

The Organic Vehicle

Suitable organic vehicles that may be used in the pastes described herein are known in the art.

In one embodiment, the organic vehicle comprises a binder and a solvent. Suitable binders include, but are not limited to, cellulose, phenolic, acrylic resins, and mixtures thereof. Suitable solvents include, but are not limited to, carbitol, terpineol, hexyl carbitol, texanol, butyl carbitol, butyl carbitol acetate, or dimethyladipate glycol ethers, and mixtures thereof.

In a preferred embodiment, the first and the second organic vehicle comprises a binder and solvent that have low burnout temperatures (approximately 350° C. or lower) in a nitrogen/low oxygen content environment (such as 10 ppm oxygen), in order to reduce the presence of char residue. Organic vehicles comprising an acrylic resin as the binder and a texanol solvent have been shown to possess optimal clean burning during firing of the paste. Suitable acrylic resins include, but are not limited to, isobutyl methacrylate, n-butyl methacrylate, and combinations thereof. Acrylic resins having a high molecular weight, about 130,000-150,000, are suitable. In a preferred embodiment, the binder is a mixture of isobutyl methacrylate and n-butyl methacrylate. The ratio of isobutyl methacrylate to n-butyl methacrylate is about 25:75 to 75:25, preferably about 1:1.

In one embodiment, the organic vehicles comprises from about 50 to about 95 wt. % (e.g., from about 60 to about 70 wt. %) of the solvent and from about 5 to about 50 wt. % (e.g., from about 30 to about 40 wt. %) of the resin. In a specific example, the organic vehicle comprises about 17.5% of isobutyl methacrylate, about 17.5% of n-butyl methacrylate, and about 65% of texanol.

The organic vehicle may also optionally include a surfactant and/or a thixotropic agent. Suitable surfactants include, but are not limited to, polyethylene oxide, polyethylene glycol, benzotriazole, poly(ethyleneglycol)acetic acid, lauric acid, oleic acid, capric acid, myristic acid, linolic acid, stearic acid, palmitic acid, stearate salts, palmitate salts, and mixtures thereof. Suitable thixotropic agents include, but are not limited to, castor wax, oxidized polyethylene wax, amide wax or a combination of amide and oxidized polyethylene wax.

Formation of the Electroconductive Paste

The electroconductive paste compositions described herein may be prepared by any method for preparing a paste composition known in the art. The method of preparation is not critical, as long as it results in a homogeneously dispersed paste. As an example, without limitation, the paste components may be mixed, such as with a mixer, then passed through a three roll mill to make a dispersed uniform paste. The paste can then be deposited, e.g., screen printed, onto a substrate to form electrically conductive leads.

Forming Copper Conductor

The electroconductive copper paste compositions may be deposited and fired in a nitrogen atmosphere on a AlN substrate to form copper conductors. FIG. 1 illustrates a top view of electroconductive copper paste composition 120 printed in a pattern on an AlN substrate 110.

The electroconductive copper paste compositions may be formulated into a base layer composition and a top layer composition. The base layer composition is typically applied directly onto the AlN substrate, and provides optimal adhesion to the AlN substrate. The top layer composition is typically applied over a fired base layer composition layer or another fired top layer composition layer. Multiple layers of the top layer composition may be applied in order to build the copper conductor to a desired thickness on the AlN substrate.

Figure 2:
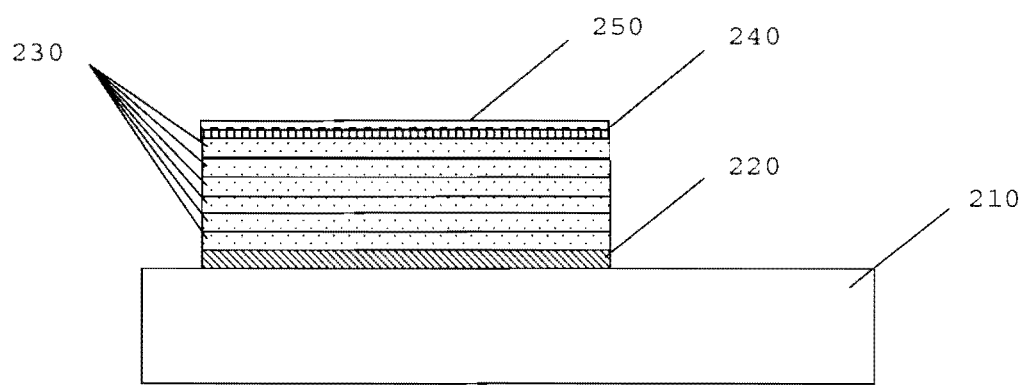
FIG. 2 is an illustrative cross-sectional view of multiple layers of an exemplary copper electroconductive paste printed and fired on an AlN substrate.

FIG. 2 illustrates a cross sectional/side view of the electroconductive copper paste compositions deposited on an AlN substrate 210. A base layer 220 electroconductive copper paste composition is first deposited on the AlN substrate 210 and fired. Subsequent layer 230 of top layer electroconductive copper paste composition is deposited on the fired base layer 220 or previously fired top layer 230 to build up the copper conductor to a desired thickness.

The electroconductive copper paste compositions may be applied to the AlN substrate via screen printing, stenciling, direct deposition, or any other means known in the art. The preferred application method is screen printing. Typically, a stainless steel mesh screen with an emulsion layer comprising the predetermined circuitry is employed for the screen printing process, for example, 105-200 stainless steel mesh with 0.5 to 0.6 mil emulsion layer thickness.

The printed electroconductive copper paste compositions are typically dried at a moderate temperature to prevent the oxidation of the copper particles. Typically, the drying temperature is about 125° C., and the drying time is about 5-10 min.

The firing of the electroconductive copper paste compositions and AlN substrate are typically conducted in a furnace at about 925° C.-950° C. peak temperature in a low oxygen atmosphere, such as a $N_2$ atmosphere, typically below 10-20 ppm $O_2$, preferably about 1-3 ppm $O_2$. Typically, the dwelling time at peak firing temperature is about 5-10 minutes, preferably 8-10 minutes.

In one embodiment, a copper conductor may be prepared on an AlN substrate using the electroconductive copper pastes described herein by a process comprising: (i) depositing a first layer of base layer electroconductive paste on an aluminum nitride substrate; (ii) drying the substrate with the deposited base layer electroconductive paste at a temperature of about 100° C. to about 125° C. for about 5 to about 10 minutes; (iii) subjecting the deposited base layer electroconductive paste and the aluminum nitride substrate to a temperature of about 900° C. to about 1000° C. in a nitrogen atmosphere comprising from about 1 to about 20 ppm oxygen; (iv) depositing a second layer of a top layer electroconductive paste on the substrate: (v) drying the aluminum nitride substrate with the deposited top layer electroconductive paste at a temperature of about 100° C. to about 125° C. for about 5 to about 10 minutes; and (vi) subjecting the deposited layers and the aluminum nitride substrate to a temperature of about 900° C. to about 1000° C. in a nitrogen atmosphere comprising from about 1 to about 20 ppm oxygen.

The copper conductor may be built to desired thickness by repeating the steps (iv)-(vi). The fired thickness of the copper conductor is about 25-50 μm for each layer of copper electroconductive paste. For example, steps (iv)-(vi) may be repeated 1-10 times. A copper conductor of a fired thickness of about 300 μm can be achieved with one layer of base layer paste and seven layers of top layer paste.

Typically, the base layer electroconductive paste composition comprises a higher amount of glass frit than the top layer electroconductive paste composition. In a preferred embodiment, the base layer electroconductive paste comprises from about 1 to about 5 wt. % of glass frit. In another preferred embodiment, the top layer electroconductive paste comprises from about 0.5 to about 1.5 wt. % of glass frit.

The base layer electroconductive paste composition may comprise a higher amount of adhesion promoter than the top layer electroconductive paste composition. In a preferred embodiment, the base layer electroconductive paste comprises from about 1 to about 5 wt. % of adhesion promoter, preferably from about 2 to about 4 wt. %, more preferably about 3 wt. % of adhesion promoter. In a preferred embodiment, the top layer electroconductive paste comprises from about 0.25 to about 1.25 wt. % of adhesion promoter, preferably from about 0.75 to about 1.25 wt. %, more preferably about 1 wt. % of adhesion promoter.

According to another embodiment, the assembly is fired in an inert (e.g., nitrogen) atmosphere according to a specific profile. If a copper electroconductive paste is fired in an environment too rich in oxygen, the copper component may begin to oxidize. However, a minimum level of oxygen is required to facilitate burnout of the organic binder in the paste. Therefore, the level of oxygen must be optimized. According to a preferred embodiment of the invention, approximately 1-20 ppm of oxygen is present in the furnace atmosphere. More preferably, approximately 1-10 ppm of oxygen is present in the furnace atmosphere, and most preferably, approximately 1-3 ppm of oxygen is present.

The copper conductor formed using the electroconductive copper paste compositions described herein can be gold plated, using processes such as an Electroless Nickel Immersion Gold (ENIG) plating process. Referring to FIG. 2, in the ENIG process, an electroless nickel plating 240 is first deposited on the copper conductor, which is then covered with a thin layer of immersion gold 250, which protects the nickel from oxidation. The ENIG process subjects the copper conductor to strong acidic conditions. The glass frit and adhesion promoter of the electroconductive copper paste compositions are chosen to withstand such processing. An alternative Electroless Nickel Electroless Palladium Immersion Gold (ENEPIG) plating process may also be used to plate the copper conductor. The plated copper conductor exhibits excellent property for wire bonding.

EXAMPLES

The following examples are given as specific illustrations of the invention. It should be understood, however, that the invention is not limited to the specific details set forth in the examples.

Example 1

Exemplary pastes according to the present invention are described in Table 1 below.

TABLE 1

Exemplary Electroconductive Paste Compositions

| Component | Broad Range (wt. %) | Narrower Range (wt. %) | Preferred Amount (wt. %) |
|---|---|---|---|
| Base layer | | | |
| | | | Paste A |
| First Copper Particle | about 45-65 | about 50-60 | 52 |
| Second Copper Particle | about 15-30 | about 17.7-25 | 21.2 |
| Third Copper Particle | about 5-15 | about 7.5-12.5 | 10 |
| Glass Frit | about 1-10 | about 2-4 | 3 |
| Adhesion Promoter | about 1-5 | about 2-4 | 3 |
| Organic Vehicle | about 5-15 | about 7.5-12.5 | 9.5 |
| Top Layer | | | |
| | | | Paste B |
| First Copper Particle | about 45-60 | about 52.5-57.5 | 55.12 |
| Second Copper Particle | about 5-15 | about 7.5-12.5 | 10.6 |
| Third Copper Particle | about 15-30 | about 20-25 | 22.48 |
| Glass Frit | about 1-5 | about 0.5-1.5 | 1 |
| Adhesion Promoter | about 0.25-1.25 | about 0.75-1.25 | 1 |
| Organic Vehicle | about 5-10 | about 5-8 | 7 |

One layer of the exemplary base layer electroconductive composition (Paste A) is screen printed using a 105-200 mesh stainless steel screen on a commercially available AlN substrate (Maruwa Co.). The exemplary base layer Paste A is dried at 125° C. for about 10 min, and fired at 950° C. for about 8-10 minutes in a nitrogen atmosphere. One layer of the exemplary top layer electroconductive composition (Paste B) is screen printed using a 105 mesh stainless steel screen on the fired exemplary base layer Paste A. The exemplary top layer Paste B is dried at 125° C. for about 10 min, and fired at 950° C. for about 8-10 min in a nitrogen atmosphere. Additional layers of exemplary top layer electroconductive composition (Paste B) are screen printed using a 105 mesh stainless steel screen on the fired exemplary top layer Paste B. The additional layers of exemplary top layer Paste B are similarly dried and fired. In this example, one base layer and seven top layer paste compositions are deposited sequentially on the AlN substrate.

Example 2

Electroless Nickel Immersion Gold (ENIG) Plating Process

A copper conductor prepared according to Example 1, using electroconductive paste compositions of Pastes A and B as described in Table 1, was subjected to an ENIG plating process according to the steps and parameters set forth in Table 2 below.

TABLE 2

ENIG Plating Process of Copper Conductor

| Process Step | Product Used | Immersion Time (minutes) | Temperature (° C.) | pH |
|---|---|---|---|---|
| Cleaner | Techniclean AT1000* | 3 | 38 | <0.5 |
| Catalyst | Technicatalyst Pd AT 4000* | 2 | 27 | <0.5 |
| Electroless Nickel | Technic EN AT5600* | 15 | 82 | 4.5-5.3 |
| Immersion (Gold) | Technic IM Gold AT6000* | 15 | 82 | 5.0-5.8 |

The copper conductor prepared according to Example 1 exhibits excellent characteristics for the ENIG plating process. The ENIG plated copper conductor shows uniformity of the nickel and gold plating. Typically, the nickel layer is about 3-5 µm, and the gold layer is about 0.25-1 µm.

Example 3

Adhesion Testing after Plating

To determine adhesion, a wire peel test was performed on the ENIG plated parts.

In this particular test, leads were positioned over 80×80 mil conductor pads which were deposited on a test coupon. The test coupons were immersed in a Alpha 615 RMA (Rosin Mildly Activated) flux to clean the surface before soldering, then soldered with SAC 305 at 240-250° C. for 5 seconds according to the parameters set forth in Table 3, and then cleaned with acetone and allowed to air dry.

TABLE 3

Solderability Testing Parameters

| Flux In | 1 second |
|---|---|
| Flux Out | 1 second |
| Solder Dwell | 5 seconds (solder acceptance and adhesion testing) |
| | 10 seconds (leach resistance testing) |

Initial adhesion was determined after the coupon was air dried after cleaning with acetone. The remaining coupons were divided into two groups and each was treated according to one of the following temperature profiles: (1) heated in a 150° C. box oven for 150 hours; or (2) subjected to thermal cycling at 40° C./150° C. for 100 cycles. Those coupons subjected to thermal cycling (subset 2) were allowed to come to room temperature and equilibrate before testing adhesion.

Lead pull testing was used to determine the force needed to pull the individual leads from the printed conductor pad after soldering. The wires were bent to a 90° angle using a mechanical fixture to minimize any variation in bend angle. Each lead was then clamped into the grip of a Zwick Z2.5 Pull Tester. Each lead was pulled perpendicularly to the substrate until it separated from the printed conductor pad. The arm movement was set at a constant speed of 10 mm/minute. The grip separation was set at 1.5 inches.

The pull testing results and failure mode of each test is set forth in Table 4. Table 4 also shows the results using a one-layer paste formulation (the base layer of Paste A), two layer (one layer of Paste A and one layer of Paste B) and an eight layer paste formulation (first layer Paste A, with layers 2-8 of Paste B).

Above the threshold pull force, three types of failures modes may occur. The wire can pull from the soldered pad (designated as "WP" in Table 4), the substrate can experience failure (designated as "DF" in Table 4), or the copper conductor pad itself can detach from the AlN substrate (designated as "PF" in Table 4).

TABLE 4

Adhesion Performance of Exemplary Pastes

| Paste Formulation | Fired Thickness (microns) | Initial Adhesion (lbs) | Aged Adhesion (lbs) | Adhesion After Thermal Cycling (lbs) | Adhesion Failure Mode Aged Adhesion | Thermal Cycling |
|---|---|---|---|---|---|---|
| One Layer (Paste A) | 29-32 | 3.50 | ND | ND | PF | ND |
| Two Layers (Paste A + B) | 65-68 | 4.20 | 4.84 | 1.70 | 100% WP | 50% PF 50% DF |
| Eight Layers Paste A + (7x)B | 286-320 | 5.90 | 5.25 | 2.36 | 66.70% WP | 100% DF |

ND: No Data

As Table 4 shows, the copper conductors formed using the copper electroconductive paste compositions described herein (having a combination of differently sized copper particles) demonstrate good adhesion to AlN substrates. After thermal aging the copper conductor still retains good adhesion to the AlN substrate. The two layer and eight layer samples exhibited good adhesion, where the wires pulled from the soldered pad and the soldered pad stayed adhered to the substrate.

Example 4

Wire Bondability Testing after Plating

To test the wire bondability of the plated parts, 250 micron aluminum wire and 1.25 micron gold wire were used. After wire bonding, the wires were pulled using a Dage Pull tester (aluminum wire) and Unitek Micropull tester (gold wire). The tester provides the strength it exerts to pull the wire from the wire bonded pads, and the unit is in grams.

The results for the eight layer composition are shown in Table 5 below. No data was obtained for the one or two layer compositions. Above the threshold pull force, four types of failures modes may occur: a break at the neck (NB), a wire break (WB), a heel break (HB) or bond lift off (WB).

TABLE 5

Wire Bondability Performance

| Paste Formulation | 250 u Al wire Initial Pull strength (g) (Failure Mode) | 250 u Al wire Aged Adhesion Pull strength (g) (Failure Mode) | 1.25 u Au wire Initial Pull Strength (g) $1^{st}$ bond (Failure Mode) | Initial Pull strength (g) $2^{nd}$ bond (Failure Mode) |
|---|---|---|---|---|
| Eight Layers | 425.4 (100% HB) | 384 (92% HB) | 13.7 (NB) | 9.9 (WB) |

As can be seen from Table 5, for aluminum wire bond, most of the failure is heel break and is acceptable according to a failure mode classification. The fired layers also have acceptable pull strength after aluminum and gold wirebonding.

These and other advantages of the invention will be apparent to those skilled in the art from the foregoing specification. Accordingly, it will be recognized by those skilled in the art that changes or modifications may be made to the above described embodiments without departing from the broad inventive concepts of the invention. Specific dimensions of any particular embodiment are described for illustration purposes only. It should therefore be understood that this invention is not limited to the particular embodiments described herein, but is intended to include all changes and modifications that are within the scope and spirit of the invention.

The invention claimed is:

1. An electroconductive paste comprising: a. 50-90 wt. % of a copper component comprising at least two shapes of copper particles each having a different median particle diameter $d_{50}$, wherein the at least two shapes of copper particles include copper spherical particles and copper angular particles; b. 0.5-10 wt. % of a glass frit; c. 0.1-5 wt. % of adhesion promoter, which is at least one member selected from the group consisting of cuprous oxide, titanium oxide, zirconium oxide, boron resinate, zirconium resinate, amorphous boron, lithium phosphate, bismuth oxide, aluminum oxide, and zinc oxide; and d. 5-20 wt. % of an organic vehicle.

2. The electroconductive paste according to claim 1, wherein the copper component comprises at least two of:
   a. a first copper particle having a median particle diameter ($d_{50}$) of about 2.0-2.9 μm;
   b. a second copper particle having a median particle diameter ($d_{50}$) of about 3.0-3.9 μm; and
   c. a third copper particle having a median particle diameter ($d_{50}$) of about 4.0-4.9 μm.

3. The electroconductive paste according to claim 2, wherein the first copper particle has a specific surface area of about 0.25-0.5 m²/g.

4. The electroconductive paste according to claim 2, wherein the second copper particle has a specific surface area of about 0.25-0.75 m²/g.

5. The electroconductive paste according to claim 2, wherein the third copper particle has a specific surface area of about 0.25-0.50 m²/g.

6. The electroconductive paste according to claim 2, wherein the first copper particle is about 45 to about 65 wt. % of the electroconductive paste.

7. The electroconductive paste according to claim 2, wherein the second copper particle is about 15 to about 30 wt. % of the electroconductive paste.

8. The electroconductive paste according to claim 2, wherein the third copper particle is about 5 to about 15 wt. % of the electroconductive paste.

9. The electroconductive paste according to claim 1, wherein the glass frit comprises about 45-65% $Bi_2O_3$, 25-45% $SiO_2$, and 1-15% $B_2O_3$, based anon total weight of the glass frit.

10. The electroconductive paste of according to claim 1, wherein the glass frit is about 0.5 to about 5 wt. % of the electroconductive paste.

11. The electroconductive paste according to claim 1, wherein the adhesion promoter is bismuth oxide.

12. The electroconductive paste according to claim 1, further comprising about 0.5 to about 3 wt. % bismuth oxide.

13. An article comprising
   (a) an aluminum nitride substrate; and
   (b) an electroconductive electrode comprising an electroconductive paste according to claim 1.

14. A method of forming an electroconductive circuit comprising:
   a. depositing a first layer of base layer electroconductive paste according to claim 1 on an aluminum nitride substrate;
   b. drying the aluminum nitride substrate with the deposited base layer electroconductive paste at a temperature at about 100° C. to about 125° C. for about 5 to about 10 minutes;
   c. subjecting the deposited base layer electroconductive paste and the aluminum nitride substrate to a temperature of about 900° C. to about 1000° C. in a nitrogen atmosphere comprising from about 1 to about 20 ppm oxygen;
   d. depositing a second layer of a top layer electroconductive paste according to claim 1 on the substrate;
   e. drying the aluminum nitride substrate with the deposited top layer electroconductive paste at a temperature at about 100° C. to about 125° C. for about 5 to about 10 minutes; and
   f. subjecting the deposited layers and the aluminum nitride substrate to a temperature of about 900° C. to about 1000° C. in a nitrogen atmosphere comprising from about 1 to about 20 ppm oxygen.

15. The method according to claim 14, wherein steps (iv)-(vi) are repeated 1-10 times.

16. The method according to claim 14, wherein the base layer electroconductive paste comprises from about 1 to about 5 wt. % of adhesion promoter, preferably from about 2 to about 4 wt. %, more preferably about 3 wt. % of adhesion promoter.

17. The method according to claim 14, wherein the top layer electroconductive paste comprises from about 0.25 to about 1.25 wt. % of adhesion promoter, preferably from about 0.75 to about 1.25 wt. %, more preferably about 1 wt. % of adhesion promoter.

18. The method according to claim 14, wherein the adhesion promoter is bismuth oxide.

19. The method according to claim 14, wherein the nitrogen atmosphere comprises from about 1 to about 10 ppm oxygen, preferably from about 1 to about 3 ppm oxygen.

20. The method according to claim 14, wherein the step of subjecting the deposited base layer electroconductive paste to a temperature, and the step of subjecting the deposited layers to a temperature, includes heating from room temperature to about 950° C. for about 5 to about 10 minutes and then cooling to room temperature.

21. The electroconductive paste according to claim 1, wherein the copper component comprises at least two of:
   a. first copper particle having a median particle diameter ($d_{50}$) of about 2.5 μm;
   b. second copper particle having a median particle diameter ($d_{50}$) of about 3.5 μm; and
   c. a third copper particle having a median particle diameter ($d_{50}$) of about 4.5 μm.

22. The electroconductive paste according to claim 1, wherein the glass frit comprises 50-60% $Bi_2O_3$, 30-40% $SiO_2$, and 1-10% $B_2O$, based upon total weight of the glass frit.

23. The electroconductive paste according to claim 1, wherein the glass frit comprises 55-60% $Bi_2O_3$, 35-40% $SiO_2$, and 5-10% $B_2O_3$, based upon total weight of the glass frit.

24. The electroconductive paste according to claim 1, wherein the glass frit is about 0.5 to about 1.5 wt % of the electroconductive paste.

25. The electroconductive paste according to claim 9, wherein the glass fit further comprises 1-10% of $Al_2O_3$, $TiO_2$, $ZrO_2$, or combinations thereof, based upon total weight of the glass frit.

26. An electroconductive paste comprising:
   a. 50-90 wt. % of a copper component comprising at least three types of copper particles each having a different median particle diameter $d_{50}$, wherein the at least two of the at least three types of copper particles include spherical particles and angular particles;
   b. 0.5-10 wt. % of a glass frit;
   c. 0.1-5 wt. % of adhesion promoter, which is at least one member selected from the group consisting of cuprous oxide, titanium oxide, zirconium oxide, boron resinate, zirconium resinate, amorphous boron, lithium phosphate, bismuth oxide, aluminum oxide, and zinc oxide; and
   d. 5-20 wt. % of an organic vehicle.

* * * * *